United States Patent
Berry et al.

(10) Patent No.: US 7,240,424 B2
(45) Date of Patent: Jul. 10, 2007

(54) METHOD OF LAMINATING LOW TEMPERATURE CO-FIRED CERAMIC (LTCC) MATERIAL

(75) Inventors: Cynthia W. Berry, Pasadena, MD (US); Alex E. Bailey, Hampstead, MD (US)

(73) Assignee: Northrop Grumman Corporation, Los Angeles, CA (US)

( * ) Notice: Subject to any disclaimer, the term of this patent is extended or adjusted under 35 U.S.C. 154(b) by 246 days.

(21) Appl. No.: 10/922,850

(22) Filed: Aug. 23, 2004

(65) Prior Publication Data

US 2005/0241128 A1    Nov. 3, 2005

Related U.S. Application Data

(60) Provisional application No. 60/566,073, filed on Apr. 29, 2004.

(51) Int. Cl.
*H05K 3/36* (2006.01)
*B32B 37/02* (2006.01)

(52) U.S. Cl. .................. 29/830; 156/182; 156/256; 156/312

(58) Field of Classification Search .......... 29/830, 29/25.41, 25.42, 609; 428/131, 325, 901; 333/208; 156/160, 182, 256, 285, 312
See application file for complete search history.

(56) References Cited

U.S. PATENT DOCUMENTS 5,382,931 A * 1/1995 Piloto et al. ............ 333/208
5,855,803 A * 1/1999 Bailey et al. ........... 156/256 X
5,919,325 A    7/1999 Goebel et al.
6,114,986 A    9/2000 Cassen et al.
6,470,545 B1  10/2002 Branchevsky
6,535,083 B1   3/2003 Hageman et al.

FOREIGN PATENT DOCUMENTS

JP      1-238934    *  9/1989 ............ 156/285 X
JP     01238934 B     9/1989

* cited by examiner

*Primary Examiner*—A. Dexter Tugbang
(74) *Attorney, Agent, or Firm*—Birch, Stewart, Kolasch & Birch, LLP

(57) ABSTRACT

A method of forming an LTCC structure having at least one open cavity on each of first and second opposing sides is disclosed that includes the steps of forming a first LTCC structure including a first side having a plurality of cavities and a second side, subjecting the first LTCC structure to a first pressure, forming a second LTCC structure including a first side having a plurality of cavities and a second side, subjecting the second LTCC structure to a second pressure, arranging the first LTCC structure and the second LTCC structure such that the first LTCC structure second side faces the second LTCC structure second side, and subjecting the placed-together first and second LTCC structures to a third pressure to join the first LTCC structure to the second LTCC structure. A product formed by the subject method is also disclosed.

12 Claims, 2 Drawing Sheets

METHOD OF LAMINATING LOW
TEMPERATURE CO-FIRED CERAMIC
(LTCC) MATERIAL

CROSS REFERENCE TO RELATED APPLICATION

The present application claims the benefit of U.S. Provisional Patent Application No. 60/566,073, filed Apr. 29, 2004, the entire contents of which are hereby incorporated by reference.

FIELD OF THE INVENTION

The present invention is directed toward a method of forming a low temperature co-fired ceramic (LTCC) structure and a low temperature co-fired ceramic structure formed by this method, and, more specifically, toward a method of increasing the flatness of portions of an LTCC structure, and an LTCC structure formed by this method.

BACKGROUND OF THE INVENTION

Multilayered ceramic structures may be used to form electronic devices such as ceramic capacitors, multilayered ceramic integrated circuits (MCIC), multichip modules, integrated circuit packaging, high temperature sensors (such as exhaust gas sensors), fuel cells, and fuel cell reformer systems. Multilayered structures also find application in transmit/receive modules in phased array radars. These devices may be used as substrates to support and interconnect electronic components mounted thereon, and, to this end, may include open cavities on one or more surfaces for receiving the electronic components.

Such multilayered structures are often made by laminating together layers or sheets of unfired ceramic tape, known in the art as "green-tape," and then firing the laminated layers to form a finished structure. Green tape is commercially available, for example, from the DuPont Company under the product designation #951AT. The tape contains a material formulation which can be a mixture of glass and ceramic fillers which sinter at about 850° C., and exhibits thermal expansion similar to alumina. Low-temperature processing permits the use of air-fired resistors and precious metal thick film conductors such as gold, silver, or their alloys.

In electronic applications, one or more of the green-tape layers may include metallized portions to provide conduction pathways for electrical current in the finished multilayered structure. The green-tape layers may also have portions punched out to define vias, channels, or cavities. A method of forming cavities in a multilayer LTCC substrate is disclosed, for example, in U.S. Pat. No. 5,855,803, entitled "Template Type Cavity-Formation Device for Low Temperature Cofired Ceramic (LTCC) Sheets" which patent is hereby incorporated by reference.

LTCC structures may be formed with open cavities on one or more faces in which integrated circuit devices or other circuit elements can be mounted. Laminating layers of green tape to form such LTCC structures requires that a constant pressure be applied to the stacked sheets of green tape. This is a relatively straightforward process when the top and bottom surfaces of the tape stack are planar. When the outer surfaces include cavities for mounting electronic components, however, it becomes difficult to apply an even pressure to both the outer surface and the floors of the cavities.

One method for applying an even pressure during a lamination process includes the use of silicone molds having a pattern of projections complimentary to a pattern of cavities on the stack of green tape layers so that the projections extend into the cavities and apply an even pressure to the floors of the cavities. Another method, disclosed in U.S. Pat. No. 5,683,535, entitled "Method and Apparatus of Producing Cavities in LTCC Substrates" and incorporated herein by reference, uses a flexible rubber sheet that conforms to the shape of the cavities when pressure is applied.

Such prior art methods work reasonably well for structure having cavities in only one surface. In these conventional methods, the structures are placed against a flat, substantially rigid, back plate while pressure is applied to the surface of the structure having cavities. However, when forming an LTCC structure having cavities in two opposing sides using known methods, a flat back plate cannot be used because this method tends to deform the cavity floors. Sometimes the floors are bowed, sometimes punctured, and in most cases a finished structure is produced that has a floor too distorted to be useful. Such floors may have a flatness variation greater than 2 mils per inch, for example; a flatness variation of less than or equal to about 1 mil per inch is required for many applications. It is therefore desirable to provide a method of increasing the flatness of portions of LTCC structures. It is also desirable to provide a method of forming LTCC structures having at least one cavity in each of first and second opposing faces that produces cavity floors with a flatness variation less than about 1 mil per inch.

SUMMARY OF THE INVENTION

These problems and others are addressed by the present invention which comprises, in a first embodiment, a method of forming an LTCC structure having at least one open cavity on each of first and second opposing sides. The method involves forming a first LTCC structure with a first side having a plurality of cavities and subjecting it to a first pressure, and forming a second LTCC structure including a first side having a plurality of cavities and subjecting it to a second pressure. The first and second structures are then arranged with the first LTCC structure second side facing the second LTCC structure second side, and the first and second LTCC structures are subjected to a third pressure to connect them.

Another aspect of the invention comprises an LTCC structure having a first side with at least one cavity having a floor and a second side opposite the first side and having at least one cavity with a floor, wherein one of the cavity floors has a flatness of less than or equal to 1 mil per inch.

A further aspect of the invention comprises a method of forming an LTCC structure having at least one opening in each of first and second opposing walls. The method involves tack laminating a first plurality of sheets of ceramic tape to form a first structure including at least one first open cavity having a floor, and tack laminating a second plurality of sheets of ceramic tape to form a second structure including at least one second open cavity having a floor. The first and second structures are arranged so that the at least one first open cavity faces away from the at least one second open cavity and then the first and second structures are laminated together.

An additional aspect of the invention comprises a method of forming an LTCC structure having at least one opening in each of first and second opposing walls that involves stacking a first set of sheets of ceramic tape to form a first stack, forming openings in a second set of sheets of ceramic tape, aligning the openings in the second set of sheets, and stacking the aligned second set of sheets on the first stack to form a first substructure including at least one first cavity having a floor. The first substructure is laminated at a pressure of about 2000 psi. The method further includes stacking a third set of sheets of ceramic tape to form a third stack, forming openings in a fourth set of sheets of ceramic tape, aligning the openings in the fourth set of sheets, stacking the aligned fourth sheets on the third stack to form a second substructure including at least one second cavity having a floor and laminating the second substructure at a pressure of about 2000 psi. The first substructure is placed against the second substructure so that the at least one first cavity faces away from the at least one second cavity, and the first substructure and second substructure are laminated at a pressure of about 3000 to 4000 psi to form a structure having open cavities facing in opposite directions and having floors with a flatness of less than or equal to 1 mil per inch.

Another aspect of the invention comprises a method of forming an LTCC structure that involves forming at least one circuit element on a first sheet of ceramic tape, stacking the first sheet of ceramic tape and at least one second sheet of ceramic tape to form a first stack, tack laminating the first stack at a first pressure to form a substructure, and laminating the substructure and at least one third sheet of ceramic tape at a second pressure greater than the first pressure.

A further aspect of the invention comprises a method of forming an LTCC structure that involves, as a first step, tack laminating a first plurality of ceramic tape sheets including a first ceramic tape sheet having a first region defining a circuit element support or a wall facing a cavity opening to form a substructure. The substructure and a second plurality of ceramic tape sheets are then laminated at a second pressure greater than the first pressure so that a flatness variation of the first region is less than or equal to about 1 mil per inch after the second-pressure laminating step.

BRIEF DESCRIPTION OF THE DRAWINGS

These aspects of the invention and others will be better understood after a reading of the following detailed description in connection with the drawing figures wherein.

DETAILED DESCRIPTION OF EMBODIMENTS OF THE INVENTION

Figure 1:
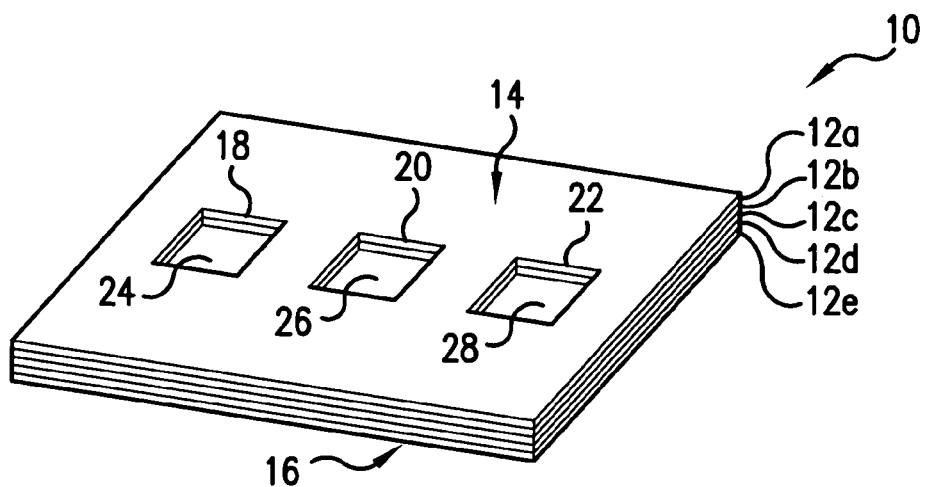
FIG. 1 is a perspective view of a first stack of layers of green tape for forming a first portion of an LTCC structure using the method of an embodiment of the present invention.

Referring now to the drawings, wherein the showings are for purposes of illustrating embodiments of the invention only and not for the purpose of limiting same, FIG. 1 illustrates a first stack 10 formed by a plurality of green tape sheets 12a, 12b, 12c, 12d, 12e and having a first or top surface 14 and a second or bottom surface 16. First stack 10 includes three cavities 18, 20, 22 formed in first surface 14, each including a cavity floor 24, 26, 28, respectively. In this embodiment, cavities 18, 20 and 22 are defined by openings formed in the layer 12a forming the top surface 14 of the stack 10 and openings formed in the next two tape sheets 12b and 12c immediately below top layer 12a. The cavity floors 24, 26, 28 are formed by portions of fourth greet tape sheet 12d located adjacent the openings in uppermost green tape sheets 12a, 12b, 12c. In this embodiment, stack 10 comprises a total of five green tape sheets, the upper three of which include openings. However, the total number of sheets can be other than five, and any number of upper sheets can have openings therein to define cavities. Furthermore, the number of cavities can be other than three, the depths of each cavity may be different, and the cavities can be arranged in substantially any desired configuration.

Figure 2:
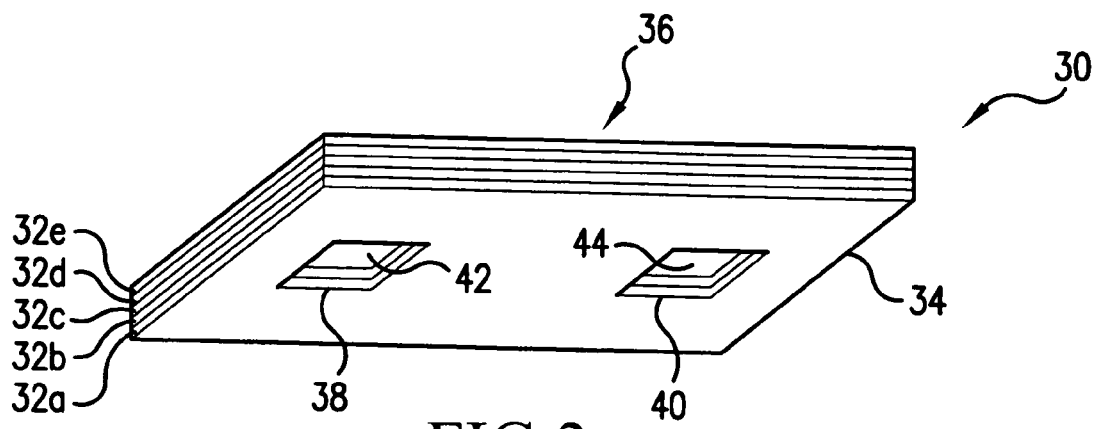
FIG. 2 is a perspective view of a second stack of layers of green tape for forming a second portion of an LTCC structure using the method of an embodiment of the present invention.

FIG. 2 illustrates a second stack 30 formed by a plurality of green tape sheets 32a, 32b, 32c, 32d, 32e having a first or bottom surface 34 and a second or top surface 36. Second stack 30 includes two cavities 38, 40 formed in first surface 34 each including a cavity floor 42, 44, respectively. As with stack 10, the number, arrangement, and depth of cavities 38, 40 can vary without departing from the scope of the present disclosure. In addition, as illustrated, for example, in FIG. 5, cavities such as cavities 20 and 22 may have different depths, and some cavities, such as cavity 40, may have a first portion 46 having a first width and a second portion 48 having a second width, or other configurations, without exceeding the scope of the present disclosure.

The method of an embodiment of the present invention involves holding the green tape sheets forming first stack 10 in registration in any conventional manner and laminating first stack 10 at a pressure of about 2000 psi to form a first structure 50, (which may also be referred to as a "substructure"). A second structure 52 is formed by processing the green tape sheets in the second stack 30 in the same manner. This laminating step performed at about 2000 psi may be referred to herein as a "prelamination" step or a "tack lamination" step and is to be distinguished from a final laminating step carried out at a higher, isostatic, pressure to transform the green tape sheet stacks into a fully laminated product. This tack laminating step planarizes the floors of the cavities and increases the density of the material of first stack 10 and second stack 30 to render the structures 50, 52 formed from these stacks 10, 30 less prone to bowing and deformation during the final pressing operation.

Figure 3:
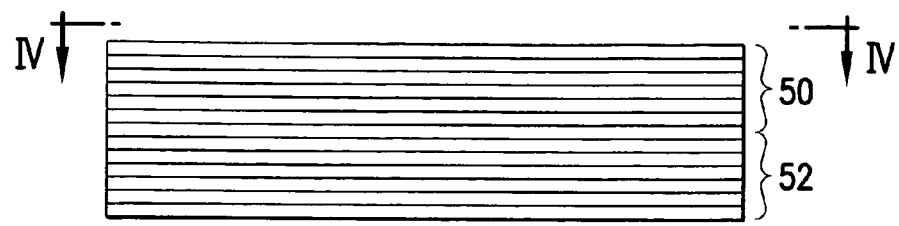
FIG. 3 is a side elevational view showing the first stack of FIG. 1 placed on the second stack of FIG. 2 to form a third stack.
Figure 4:
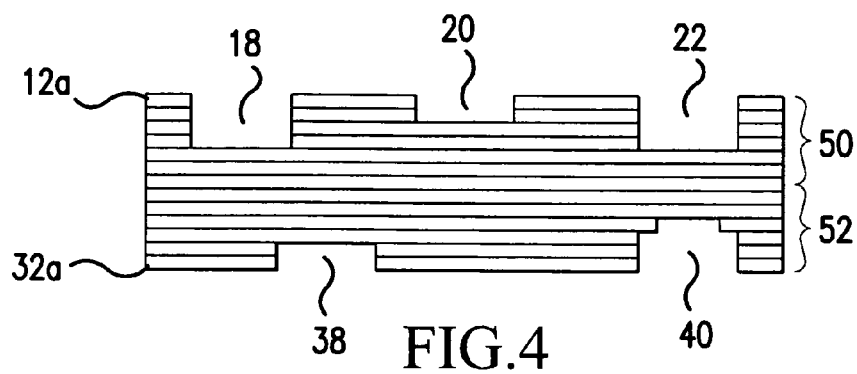
FIG. 4 is a sectional elevational view taken along line IV-IV in FIG. 3.

The first and second structure 50, 52 are stacked one atop the other as illustrated in FIGS. 3 and 4. While the first structure 50 is shown in contact with the second structure 52 in FIGS. 3 and 4, it is also contemplated that additional layers of green tape, pre-laminated or not, could be placed between first structure 50 and second structure 52 before the final laminating step is carried out.

Figure 5:
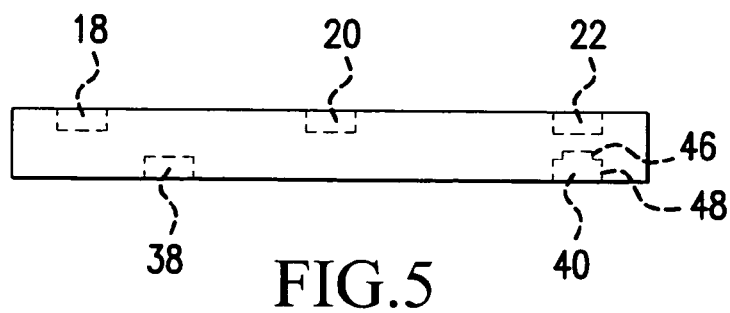
FIG. 5 is a side elevational view of an LTCC structure according to an embodiment of the present invention formed by laminating the third stack of FIG. 3.

Such a final lamination step is carried out at about 3000 to 4000 psi to produce the consolidated LTCC structure 54 illustrated in FIG. 5. Using this method, the floors 24, 26, 28, 42, 44 are formed with a flatness variation of less than or equal to about 1 mil per inch, and the inventors of the present application have found that this degree of flatness is desirable for many applications.

Figure 6:
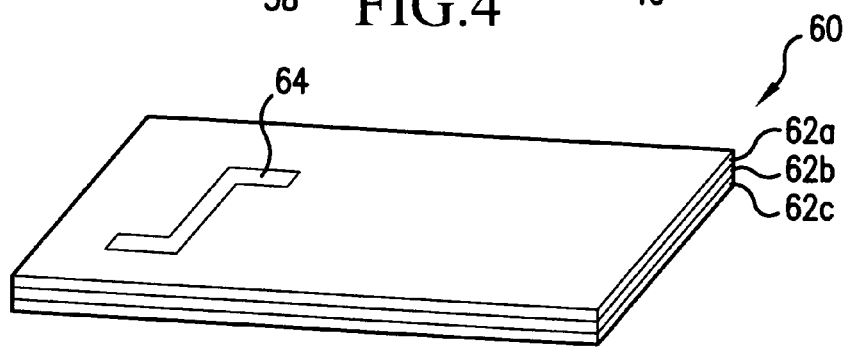
FIG. 6 is a perspective view of a fourth stack of layers of green tape including at least one circuit element according to another embodiment of the invention.

Referring now to FIG. 6, a second embodiment of the present invention is disclosed which comprises a method of forming an LTCC structure having one or more regions of improved flatness. This region may comprise, for example, a circuit element support for a circuit element that needs to be attached to a planar surface, or a wall facing an opening in an LTCC structure (such as the floor of one of the cavities described in connection with the first embodiment).

Figure 7:
FIG. 7 is a perspective view of the fourth stack of FIG. 6 after being tack laminated.
Figure 8:
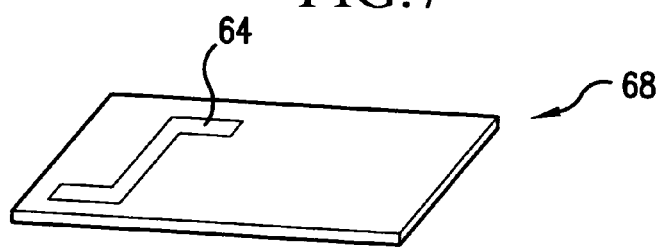
FIG. 8 is a perspective view of the tack-laminated fourth stack of FIG. 7 after being laminated with additional sheets of green tape.

In this method, a third stack 60 of green tape sheets is formed from a first tape sheet 62a having a circuit element 64 formed thereon and at least two additional tape sheets 62b, 62c. This circuit element may comprise, for example, a dielectric tape. When an LTCC is laminated by conventional processes, some layers, including layers supporting circuit elements such as circuit element 64 may be distorted and therefore may not have an adequate degree of flatness after the conventional lamination process is completed. This distortion occurs because the dielectric tape may conform around internal circuit features such as via posts and printed circuits if a plurality of green tape sheets are consolidated in a single step. Such distortion is acceptable in some applications but should be minimized in structures that include, for example, embedded filters and millimeter wave circuitry, which may be adversely affected by these distortions According to this embodiment of the invention, a prelamination step is carried out on third stack 60 to produce the partially laminated substructure 66 shown in FIG. 7. This partially laminated substructure is then incorporated into a structure 68 shown in FIG. 8 by performing a final laminating step to join additional sheets of green tape and/or additional prelaminated structures (not shown) to structure 68. Beneficially, performing such a prelamination step on third stack 66 reduces distortion of the layer 62a supporting circuit element 64 during a final laminating step.

Beneficially, the above-described process can also be used in the manufacture of structures having internal cavities, including, for example, ferrite toroids.

The present invention has been described above in terms of several embodiments, it being understood that obvious additions and changes to these embodiments will become apparent to those skilled in the relevant arts upon a reading of the foregoing disclosure. All such obvious modifications and additions are intended to form a part of the present invention to the extent that they are included within the scope of the several claims appended hereto.

We claim:

1. A method of forming an LTCC structure having at least one open cavity on each of first and second opposing sides comprising the steps of:
    forming a first LTCC structure comprising a first side including a plurality of cavities and a second side;
    subjecting the first LTCC structure to a first pressure to laminate the first LTCC structure;
    forming a second LTCC structure comprising a first side having a plurality of cavities and a second side;
    subjecting the second LTCC structure to a second pressure to laminate the second LTCC structure;
    arranging the first LTCC structure and the second LTCC structure such that the first LTCC structure second side faces the second LTCC structure second side; and
    subjecting the first and second LTCC structures to a third pressure to join the first LTCC structure to the second LTCC structure.

2. The method of claim 1 wherein said step of forming a first LTCC structure comprising a first side including a plurality of cavities and a second side comprises the steps of:
    providing a first unfired ceramic sheet;
    forming at least one via in the first unfired ceramic sheet;
    forming a wiring pattern on the first unfired ceramic sheet;
    providing a second unfired ceramic sheet;
    forming a first cavity in the second unfired ceramic sheet; and
    stacking the second unfired ceramic sheet on the first unfired ceramic sheet.

3. The method of claim 1 including the additional step of placing the first LTCC second side against a flat support before said step of subjecting the first LTCC structure to a first pressure.

4. The method of claim 3 including the additional step of placing on the first LTCC first side a polyimide layer having cutouts aligned with the first plurality of cavities on the first side before said step of subjecting the first LTCC structure to a first pressure.

5. The method of claim 1 wherein said step of forming a first LTCC structure comprising a first side including a plurality of cavities and a second side comprises the step of forming a plurality of cavities having equal depths.

6. The method of claim 1 wherein said step of forming a first LTCC structure comprising a first side including a plurality of cavities and a second side comprises the step of forming a cavity having a first portion having a first width and a second portion having a second width.

7. A method of forming an LTCC structure having at least one open cavity on each of first and second opposing sides comprising the steps of:
    forming a first LTCC structure comprising a first side including a plurality of cavities and a second side;
    subjecting the first LTCC structure to a first pressure to laminate the first LTCC structure;
    forming a second LTCC structure comprising a first side having a plurality of cavities and a second side;
    subjecting the second LTCC structure to a second pressure to laminate the second LTCC structure;
    arranging the first LTCC structure and the second LTCC structure such that the first LTCC structure second side faces the second LTCC structure second side; and
    subjecting the first and second LTCC structures to a third pressure to join the first LTCC structure to the second LTCC structure;
    wherein said step of subjecting the first and second LTCC structure to a third pressure comprises the step of subjecting the first and second LTCC structures to a third pressure greater than the first pressure and greater than the second pressure.

8. The method of claim 7 wherein the first pressure is substantially equal to the second pressure.

9. A method of forming an LTCC structure having at least one open cavity on each of first and second opposing sides comprising the steps of:
    forming a first LTCC structure comprising a first side including a plurality of cavities and a second side;
    subjecting the first LTCC structure to a first pressure to laminate the first LTCC structure;
    forming a second LTCC structure comprising a first side having a plurality of cavities and a second side;
    subjecting the second LTCC structure to a second pressure to laminate the second LTCC structure;
    arranging the first LTCC structure and the second LTCC structure such that the first LTCC structure second side faces the second LTCC structure second side; and subjecting the first and second LTCC structures to a third pressure to join the first LTCC structure to the second LTCC structure;

wherein said step of forming a first LTCC structure comprising a first side including a plurality of cavities and a second side comprises the step of forming a cavity having a closed bottom.

10. The method of claim 9 wherein said step of forming a second LTCC structure comprising a first side having a plurality of cavities and a second side comprises the step of forming a cavity having a closed bottom.

11. A method of forming an LTCC structure having at least one open cavity on each of first and second opposing sides comprising the steps of:

forming a first LTCC structure comprising first and second opposing sides, the first side including a plurality of cavities each having a floor spaced from the second side;

subjecting the first LTCC structure to a first pressure to laminate the first LTCC structure;

forming a second LTCC structure comprising first and second opposing sides, the first side including a plurality of cavities each having a floor spaced from the second side;

subjecting the second LTCC structure to a second pressure to laminate the second LTCC structure;

arranging the first LTCC structure and the second LTCC structure such that the first LTCC structure second side faces the second LTCC structure second side; and subjecting the first and second LTCC structures to a third pressure to join the first LTCC structure to the second LTCC structure.

12. The method of claim 11 wherein said step of subjecting the first and second LTCC structures to a third pressure comprises the step of subjecting the first and second LTCC structures to a third pressure greater than the first pressure and greater than the second pressure.

* * * * *